US008114304B2

(12) United States Patent
Leib et al.

(10) Patent No.: US 8,114,304 B2
(45) Date of Patent: Feb. 14, 2012

(54) METHOD FOR PRODUCING ELECTRONIC COMPONENTS (75) Inventors: Jürgen Leib, Freising (DE); Florian Bieck, Mainz (DE)

(73) Assignee: Wafer-Level Packaging Portfolio LLC, Cupertino, CA (US)

( * ) Notice: Subject to any disclaimer, the term of this patent is extended or adjusted under 35 U.S.C. 154(b) by 895 days.

(21) Appl. No.: 11/603,388

(22) Filed: Nov. 22, 2006

(65) Prior Publication Data

US 2007/0063202 A1 Mar. 22, 2007

Related U.S. Application Data (62) Division of application No. 10/487,604, filed as application No. PCT/EP02/09497 on Aug. 26, 2002, now Pat. No. 7,160,478.

(30) Foreign Application Priority Data

Aug. 24, 2001 (DE) .................................. 101 41 558
Aug. 24, 2001 (DE) .................................. 101 41 571
May 23, 2002 (DE) .................................. 102 22 960

(51) Int. Cl.
*B29D 11/00* (2006.01)
(52) U.S. Cl. ......................................................... 216/24
(58) Field of Classification Search .................... 359/811
See application file for complete search history.

(56) References Cited

U.S. PATENT DOCUMENTS

| | | | |
|---|---|---|---|
| 5,100,219 A * | 3/1992 | Takahashi | ........................ 385/30 |
| 5,500,540 A | 3/1996 | Jewell et al. | |
| 5,761,350 A | 6/1998 | Koh | |
| 5,915,168 A | 6/1999 | Salatino et al. | |
| 6,198,168 B1 | 3/2001 | Geusic et al. | |
| 6,235,141 B1 | 5/2001 | Feldman et al. | |
| 6,243,508 B1 * | 6/2001 | Jewell et al. | ..................... 385/14 |
| 6,328,482 B1 * | 12/2001 | Jian | .................................. 385/88 |
| 6,351,027 B1 | 2/2002 | Giboney et al. | ............... 257/684 |
| 6,566,745 B1 | 5/2003 | Beyne et al. | |
| 6,777,767 B2 * | 8/2004 | Badehi | ......................... 257/432 |

(Continued)

FOREIGN PATENT DOCUMENTS

DE 199 16 572 10/2000

(Continued)

OTHER PUBLICATIONS

Pfeiffer, J. et al., "Tunable Wavelength-Selective WDM Photodetector Based on MOEMS," Annual Report Tech. Univ. Darmstadt, XX, XX, 1999, pp. 94-98, XP002195782.

(Continued)

*Primary Examiner* — James Jones (74) *Attorney, Agent, or Firm* — Edward P. Heller, III (57) ABSTRACT In order to achieve an integration of functional structures into the housing of electronic components, provision is made of a method for producing an electronic component comprising at least one semiconductor element having at least one sensor-technologically active and/or emitting device on at least one side, the method comprising the following steps: provision of at least one die on a wafer, production of at least one patterned support having at least one structure which is functional for the sensor-technologically active and/or emitting device, joining together of the wafer with the at least one support, so that that side of the die which has the sensor-technologically active and/or emitting device faces the support, separation of the die.

3 Claims, 6 Drawing Sheets

U.S. PATENT DOCUMENTS

| | | |
|---|---|---|
| 6,967,124 B1 | 11/2005 | Huemoeller et al. |
| 6,974,966 B1 | 12/2005 | Jayaraman |
| 2002/0163054 A1* | 11/2002 | Suda .............................. 257/431 |
| 2003/0011888 A1* | 1/2003 | Cox et al. ....................... 359/626 |
| 2003/0021034 A1* | 1/2003 | Yoshikawa et al. ............ 359/619 |
| 2004/0023469 A1* | 2/2004 | Suda .............................. 438/458 |
| 2005/0052751 A1* | 3/2005 | Liu et al. ........................ 359/626 |

FOREIGN PATENT DOCUMENTS

| | | |
|---|---|---|
| DE | 101 41 571 | 3/2003 |
| DE | 102 22 959 | 12/2003 |
| DE | 102 22 960 | 12/2003 |
| EP | 550 973 | 7/1993 |
| JP | 8111542 | 4/1996 |
| JP | 9199736 | 7/1997 |
| JP | 10098121 | 4/1998 |
| WO | WO 95/28744 | 10/1995 |
| WO | WO 99/18612 | 4/1999 |
| WO | WO 99/40624 | 8/1999 |
| WO | WO 01/43181 A1 | 6/2001 |

OTHER PUBLICATIONS

Jim K L et al., "Fabrication of Wafer Level Chip Scale Packaging for Optoelectronic Devices;" 1999 Proceedings 49th Electronic Components and Tech. Conf., San Diego, CA, Jun. 1999, pp. 1145-1147, XP002248941.

Leclercq J-L et al., "InP-based MOEMS and Related Topics," Journal of Micromechanics and Microengineering, New York, NY, Bd. 10, Nr. 2, 27, Sep. 1999, pp. 287-292, XP008002312.

Office Action for the corresponding Japanese Patent Application No. 2003-522978 dated Oct. 6, 2008.

Search Report and Written Opinion for the corresponding Singapore Patent Application No. 200602593-6 dated Jul. 4, 2008.

* cited by examiner

METHOD FOR PRODUCING ELECTRONIC COMPONENTS

CROSS REFERENCE TO RELATED APPLICATIONS

This application is a divisional of U.S. application Ser. No. 10/487,604 filed Aug. 13, 2004, which issued on Jan. 9, 2007 as U.S Pat. No. 7,160,478, which claims the benefit under 35 U.S.C. §365 of International Application Ser. No. PCT/EP2002/009497, filed Aug. 26, 2002 and claims benefit under 35 U.S.C. §119 of German Patent Application No. 102 22 96 00, filed May 23, 2002, German Patent Application No. 101 41 57 10, filed Aug. 24, 2001, and German Patent Application No. 101 41 55 83, filed on Aug. 24, 2001.

BACKGROUND OF THE INVENTION

1. Field of the Invention

The invention relates to a method for producing electronic components, and to a housed electronic component. In particular, the invention relates to a method for producing housed electronic components joined in a wafer having a patterned support, and to a housed electronic component having a patterned support.

2. Description of Related Art

Integrated electronic components are produced nowadays by employing, inter alia, various wafer level packaging methods. Inter alia, this method is also used to produce optoelectronic components. For this purpose, the components are provided with light-transmissive coverings which protect the light-sensitive components from ambient influences, such as moisture, for example, or for instance from mechanical damage.

However, in this case, mechanical and optical functions have hitherto been realized independently of the actual housing of the semiconductor in the case of later mounting. Thus, by way of example, optical arrangements, such as plastic objectives or glass fibers, are connected to the housed optical chip after the production thereof. However, this inevitably leads to large manufacturing tolerances in comparison with the high accuracy that can otherwise be achieved in the production of integrated circuits. Moreover, after dicing, that is to say separation of the chips or dies from the wafer, the finished housed components have to be realigned and reoriented before the optical elements are emplaced, which leads to additional manufacturing steps and correspondingly slows down production and makes it more expensive.

BRIEF SUMMARY OF THE INVENTION

Therefore, the invention is based on the object of avoiding or at least alleviating these disadvantages in the production and the construction of electronic components, such as, in particular, optoelectronic components.

Accordingly, the method according to the invention for producing an electronic component comprising at least one semiconductor element having at least one sensor-technologically active and/or emitting device on at least one side, the method comprising the following steps: provision of at least one die on a wafer, production of at least one patterned support having at least one structure which is functional for the sensor-technologically active and/or emitting device, joining together of the wafer with the at least one support, so that that side of the die which has the sensor-technologically active and/or emitting device faces the support, separation of the die.

In this connection, an electronic component is understood to be a component which can convert electrical signals into other signals, and/or other signals into electrical signals. In particular, it is understood to mean optoelectronic components, which can convert optical signals into electrical signals and vice versa. However, the term electronic component also equally encompasses other sensor-technological and/or emitting elements which, by way of example, can convert physical measurement quantities such as sound or pressure or chemical measurement quantities such as concentrations, for example, into electrical signals or vice versa.

In the method according to the invention, the components are joined together with the support, which is provided with structures which are functional for the sensor-technologically active and/or emitting device, whilst already joined in a wafer. This enables the structures of the support to be oriented exactly with respect to the sensor-technologically active and/or emitting device, such as, for example, a photoelectric sensor layer. Furthermore, the method according to the invention also integrates the wafer level packaging through the application of the patterned support at least partially with the provision of further functional structures or elements, such as, for example, optical lenses for optoelectric components. This saves further process steps in the production of such sensor-technologically active and/or emitting components. Moreover, the dimensions of the component can be made considerably smaller through the greater proximity of the functional structures of the support to the sensors or emitting structures on the chip, which makes a significant contribution to the miniaturization of such electronic components.

In a particularly advantageous manner, the method according to the invention may also comprise the production of a multilayer patterned support. In this case, these layers may also have different materials. Thus, it is possible, by way of example, to combine transparent layers made of glass or plastic with semiconductor layers.

In particular, it is advantageous if the individual layers in each case have at least one structure which is functional for the sensor-technologically active and/or emitting device. By way of example, it is possible in this way to assemble multi-element optical arrangements for optoelectronic components.

The patterning may be effected in the state joined together with the wafer. By way of example, polyreflow lenses may be applied on the support. The patterning in the joined-together state is also advantageous, inter alia, when the support is so thin that the patterning operation, for instance by means of mechanical processing, would destroy the support. By virtue of being joined together with the wafer, the support is supported and will thus impart an increased strength to the construction, which enables the non-destructive processing of the support.

A prefabrication of structures on the support before the joining-together process is also advantageous. The support with the prefabricated structures can then be oriented exactly with respect to the wafer when being joined together with side wafer, by way of example. The prefabrication of the structures and the subsequent connection to the wafer permit the use of materials on the semiconductor which would not withstand the preliminary processes of the patterning of the support. By way of example, this makes it possible to use biosensor-technological receptors or organic microlenses on the semiconductor element.

The individual layers of the multilayer patterned support need not first be connected to one another before this composite is joined together with the wafer. Rather, it is also advantageous if the process of joining together with the support is carried out in such a way that individual layers are joined to the wafer, for example the composite comprising wafer and the layers already joined together with the latter. By way of example, each layer can then be oriented separately to the structures of the wafer. Moreover, this also enables a patterning of the layers fixed on the wafer or, by way of example, a mechanical thinning of the layers in the wafer composite.

The production of the support may be carried out for example by means of lithographic patterning. This may be performed by the use of suitable shadowmasks or else by the molding of a preform produced lithographically (LIGA method).

In order to produce suitable functional structures of the support, the latter may be patterned both negatively and positively.

In this case, the negative patterning is preferably produced by dry etching and/or wet-chemical etching and/or mechanical grinding, or grinding and/or mechanical lapping. Positive structures can be produced, inter alia, by means of vapor deposition, sputtering of material, CVD or PVD coatings, plating or stencil printing and resist coating.

Patterned supports having spacers for optical elements are of interest, inter alia, for miniaturized optical arrangements. By virtue of the high accuracy which can be achieved in the positioning of the support and the high parallelism of wafer surface and support which is achieved by the process of joining together in the wafer composite, it is possible to construct, even at a miniature scale, for example in the case of optoelectronic components, precision optical arrangements for the sensor-technologically active and/or emitting devices of the dies on the wafer, which, after the separation, or dicing, of the wafer, form the semiconductor elements of the electronic components.

Moreover, receptacles can be produced in the support, which receptacles may receive, by way of example, fluids, for instance for sensor applications in fluidics or for chemical sensors, optical elements, microelectronic components or active or passive electronic elements. The receptacles may also receive, with an accurate fit, separate sensor or emitter components, for example piezoelectric pressure sensors or piezoelectric emitters, such as, for instance, ultrasonic emitters.

Cavities are also taken into consideration as further functional structures. In particular, the patterned support may in this case be produced in such a way that at least one resonator space is defined in the component. These cavities defined in the support or between support and semiconductor element may in this case also be at least partly open. A cavity may also advantageously surround the surface of the sensor-technologically active and/or emitting device or optical elements arranged thereon and thus protect said surface or elements from damage, for example.

For many applications, mechanical fits are also particularly advantageous as structures of the support. By way of example, a fit for a waveguide may be produced in the support. In this case, too, the high accuracy which can be achieved in the orientation of the support with the wafer in the wafer composite may once again advantageously be utilized in order to bring the waveguide core into precise orientation with a sensor or emitter structure on the die or chip. Equally, a mechanical fit may also serve for the orientation of other functional elements, such as, for instance, lenses or further supports. These may also be mounted in later manufacturing processes, for instance after the dicing of the wafer. Even during the subsequent mounting of further elements, the precision which can be achieved in the assembly of support and wafer in the wafer composite and the accuracy thus achieved in the orientation of the fit are transferred to the further elements.

Moreover, the support may be patterned in such a way that it itself comprises optical components such as, for instance, lenses or gratings as functional structures. In an advantageous manner, the support may furthermore be produced in such a way that it has at least one passage as a functional structure. Such passages may fulfil the task, in particular, of producing a connection to the sensor-technologically active and/or emitting device or sensor or emitter structure with respect to other functional structures or with respect to the surroundings of the component.

What are taken into consideration as optical components which can be integrated into the support during the production thereof are, inter alia, generally concave and/or convex lenses, Fresnel lenses or prism lenses, gratings, in particular phase gratings, and/or prisms. Prisms may be combined for example in combination with guides or fits for waveguides in order that the light from waveguides guided along the surface of the component is diverted to the sensor-technologically active and/or emitting device.

Finally, trenches, in particular V-grooves, are also suitable as functional structures for specific applications. In this case, a trench or a V-groove extends on the support preferably in a direction along the surface of the support. Such grooves or trenches may be used, inter alia, for receiving and fixing waveguides. By way of example, this results, as described above, in an advantageous combination of V-grooves as guides for waveguides in conjunction with prisms as light-diverting elements.

The method according to the invention can also advantageously be extended in such a way that the joining together of the wafer with the at least one patterned support additionally comprises the step of joining together with at least one further support acting as a spacer. In this way, one or a plurality of patterned supports acting as a spacer can be combined with one another and/or with a support, which have further functional structures, such as lenses, mechanical fits or the like.

Inter alia, the support may advantageously be produced from a semiconductor material, in particular silicon or gallium arsenide. Indium phosphide, which otherwise has to be hermetically sealed, may also be used as support material, it being possible to obtain the hermetic sealing for example by means of further layers of the support whilst actually in the wafer composite. The abovementioned semiconductor materials can be processed precisely by known methods in order to produce the respective functional structures. Glass, in particular quartz glass, and/or metal as material for the supports may also be used in an advantageous manner depending on the intended area of use of the component. Interesting properties may also be achieved, inter alia, with glass foams or metal foams.

Generally, low-k dielectrics may also advantageously be used, for example in order to reduce parasitic capacitances on the components and thus to improve the radio frequency properties of the components. Various plastics or foamed materials, such as foamed glasses, may be used, inter alia, as low-k materials. This is also advantageous in particular when the semiconductor component comprises a radio frequency component.

Sapphire as support material also has outstanding properties for some applications, for example on account of its high thermal conductivity and UV transmissivity.

Furthermore, composite materials, ceramics or plastics or many other inorganic and organic materials may advantageously be used as support material depending on area of application and purpose.

In particular, support and wafer may comprise an identical material. This affords the possibility, inter alia, of processing the wafer with the dies and the support by means of the same methods in a manner that saves costs.

Wafer and support may furthermore be produced in such a way that they have thermal expansion coefficients which are adapted to one another at the interfaces which face one another. It is thus possible to avoid, or reduce, thermal stresses between wafer and support. Examples of suitable materials are kovar for GaAlAs wafers and D263 glass for the support. The glasses AF45, AF37 or B33 may be used, inter alia, for Si(100) wafers.

In particular, anodic bonding of the wafer to the support is suitable in order to join together wafer and support. Also conceivable, however, depending on the materials used, are adhesive bonds, for example with polymers and/or epoxy adhesives, connection by means of alloy soldering of previously metallized regions of the wafer and/or of the support, and also diffusion welding or connection by means of glass solders. If the support comprises more than one layer, the various joining-together methods may also be combined with one another. In particular for supports comprising glass, glass soldering may also advantageously be used for the joining-together process.

In order to facilitate the dicing of the overall construction comprising wafer and support, separating points may additionally be inserted into the support during the patterning of the support.

Furthermore, the method may also be developed in such a way that, in addition to the structures on the support, functional structures are produced on a side opposite to that side of the die which has the sensor-technologically active and/or emitting device. Thus, by way of example, signals coming from two sides can be fed to the component without impairing sensor-technological functions on the side of the component having the sensor-technologically active and/or emitting device.

The invention also provides for the provision of an electronic component having a construction that is improved with regard to the abovementioned disadvantages of electronic components. Accordingly, an electronic component according to the invention, which, in particular, is produced according to the method described above and comprises the at least one semiconductor element, has a sensor-technologically active and/or emitting device on a first side, the semiconductor element being covered on the first side with a patterned support additionally having at least one structure which is functional for the sensor-technologically active and/or emitting device.

The functional structures of the support may have been produced for example by means of dry etching, wet-chemical etching, mechanical grinding, or grinding, mechanical lapping, vapor deposition, sputtering, CVD or PVD coating, plating or by means of stencil printing or resist coating.

In this case, the patterned support of the electronic component may serve, inter alia, as a spacer in order to produce a spacing between the sensor-technologically active and/or emitting device of the semiconductor element and a functional element, such as, for example, a lens for an optoelectronic component.

The patterned support may also be configured in such a way that it defines a receptacle. In particular, such a receptacle may receive fluids, optical elements, microelectronic components, active or passive electronic elements or else piezoelectric components.

Moreover, the patterned support may advantageously have a mechanical fit, thereby enabling, inter alia, an accurately defined position of an element fitted therein, such as of a waveguide, for instance.

For specific applications of components according to the invention, however, functional structures may be situated not only on that side of the component which has the sensor-technologically active and/or emitting device. Rather, the component may have such structures on the opposite side as well.

The support on the semiconductor element may, in particular, have a plurality of layers, in which case said layers may also be composed of different materials. The layers may in each case have at least one structure which is functional for the sensor-technologically active and/or emitting device. What may be involved in this case, in particular, are respectively different functional structures which are combined with one another by means of the sequence of layers. Thus, for optoelectronic components, for example, layers which have a passage and act as a spacer may be combined with layers which have lenses. Such a component is then distinguished by a complex, multi-element optical arrangement which is placed with high accuracy directly on the semiconductor element.

The invention is explained in more detail below using preferred embodiments and with reference to the accompanying drawings. In this case, identical reference symbols refer to identical or similar parts.

DETAILED DESCRIPTION OF THE INVENTION

Figure 1A:
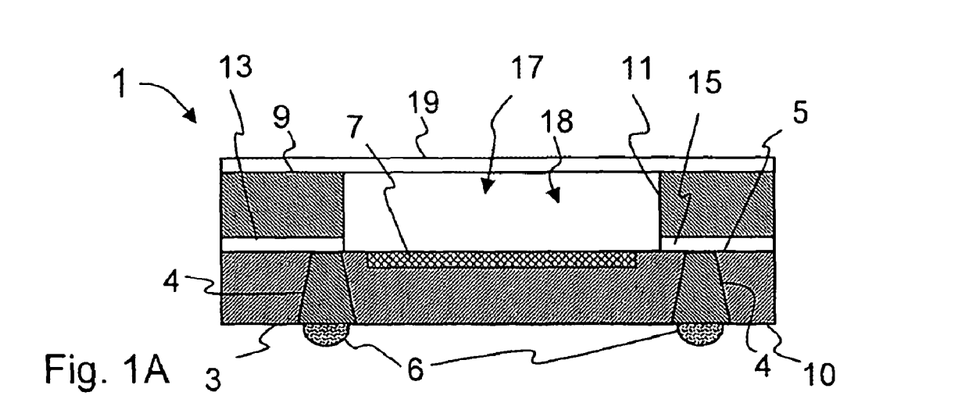
FIG. 1A shows a cross section through an embodiment of the invention with a support patterned as a passage.

FIG. 1A illustrates a cross section through a first embodiment of an electronic component according to the invention, which is designated in its entirety by 1. The electronic component 1 comprises a semiconductor element or die 3 having a sensor-technologically active and/or emitting device 7 on a first side 5, which is referred to as the top side hereinafter. The sensor-technologically active and/or emitting device 7 may be, by way of example, a photoelectric layer for converting electrical signals into optical signals or vice versa. On its top side 5, the semiconductor element 3 is joined together with the underside 13 of a patterned support 9. The connection between component 3 and patterned support 9 is imparted by means of a connecting layer 15 situated between these parts.

The patterned support 9 has a passage opening 17 as a structure 11 which is functional for the sensor-technologically active and/or emitting device 7. Said passage opening defines a cavity 18 together with the covering 19—applied to the support 9—and the top side 5 of the semiconductor element 3. Given a suitable choice of the connecting layer 15, the cavity 18 can be hermetically partitioned from the surroundings, so that, by way of example, no moisture can penetrate. Such a connection between component 3 and support 9 may be achieved, inter alia, by anodic bonding.

In the case of an optoelectronic component, what is achieved by virtue of the cavity 18 is that the photoelectric layer 7 of said component is surrounded by a medium having a low refractive index. Equally, the cavity 18 formed by means of the functional structure 11 may serve as a receptacle for a fluid, for instance in order to be able to perform chemical analyses of the fluid phase using a specially adapted sensor-technologically active and/or emitting device 7 in the form of a sensor layer.

Such a cavity 18 may also serve as a resonator. By way of example, the sensor-technologically active and/or emitting device 7 may also be a device for generating or for detecting electromagnetic radio frequency waves microwaves or ultrasound.

Furthermore, such a cavity may also serve for improving the radio frequency properties of the packaged component. In particular, for this purpose, the cavity may have a medium having a dielectric constant of equal to 1 or almost 1. By way of example, the cavity may for this purpose be evacuated or filled with gas. The cavity may also be filled with a low-k material for the same purpose. A low dielectric constant of the cavity medium helps to reduce parasitic capacitances of the semiconductor component. Low-k materials may also generally be used as covering materials of the support, in particular in the region of the direct surroundings of the semiconductor component and/or the leads thereof.

The electronic component 1 may additionally be produced in such a way that the contacts for the connection of the component are located on the underside 10 thereof. For this purpose, it is possible to produce plated-through holes 4 through the substrate of the semiconductor element. Said plated-through holes may be produced for example by inserting passages into the substrate, which are subsequently filled with a conductive material. Soldering beads 6 may be applied on the plated-through holes for the connection to a circuit board.

Figure 1B:
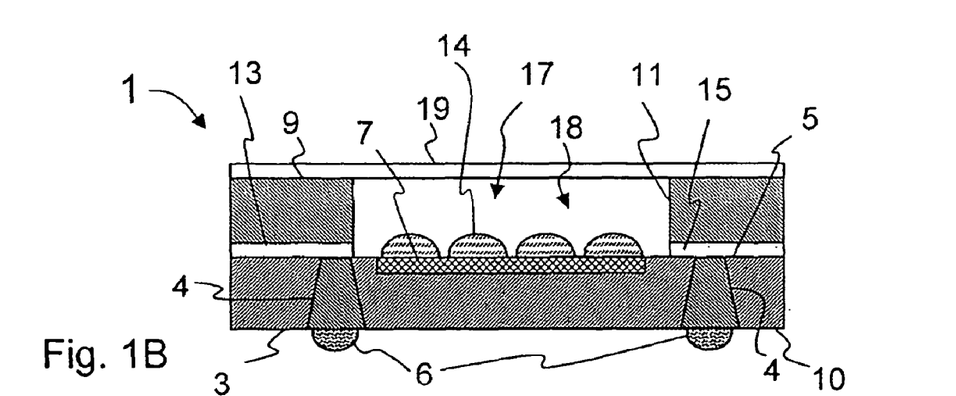
FIG. 1B shows a variant of the embodiment shown in FIG. 1A.

FIG. 1B shows a variant of the embodiment of the invention illustrated in FIG. 1A. In order to produce the electronic component 1 shown in FIG. 1B, a patterned support 9 is likewise applied to a wafer with a semiconductor element and the latter is then subsequently separated, a passage opening 17 assigned to the semiconductor element 3 being inserted in the patterned support. In the state joined together with the wafer, the passage opening defines a cavity together with the covering 19 of the support 9, said cavity surrounding the surface of the sensor-technologically active or emitting device. Prior to the wafer being joined together with the support 9, optical elements 14, such as, for example, lenses or prisms, were placed directly onto the surface of the sensor-technologically active or emitting device. By way of example, lenses may be produced for this purpose by means of polymer reflow on the device 7. Thus, after the joining-together process, the cavity 18 also encloses these optical elements, so that the sensor-technologically active or emitting device 7 and the optical elements 14 are hermetically sealed and protected from damage.

Figure 2:
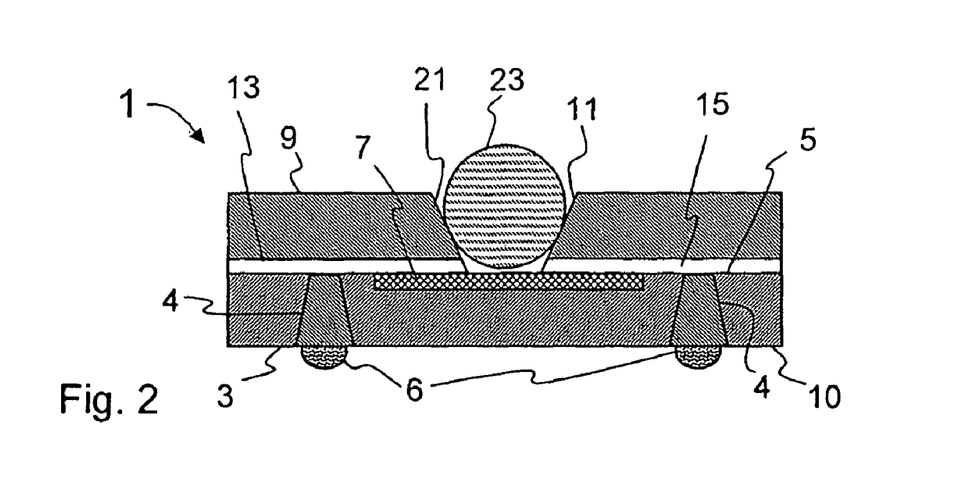
FIG. 2 shows a cross section through an embodiment of the invention with a support patterned as a mechanical fit for spherical lenses.

FIG. 2 shows a cross section through a further embodiment. Here, the functional structure 11 of the patterned support 9 defines a mechanical fit 21 for an optical element. In this case, the structure 11 is preferably embodied in the form of a trench extending along a direction perpendicular to the paper plane. The dimensions of the trench are suitable for receiving poured spherical lenses 23, one of which is shown in the figure. The spherical lenses may be fixed with the patterned support 9 after filling with a transparent adhesive.

Figure 3:
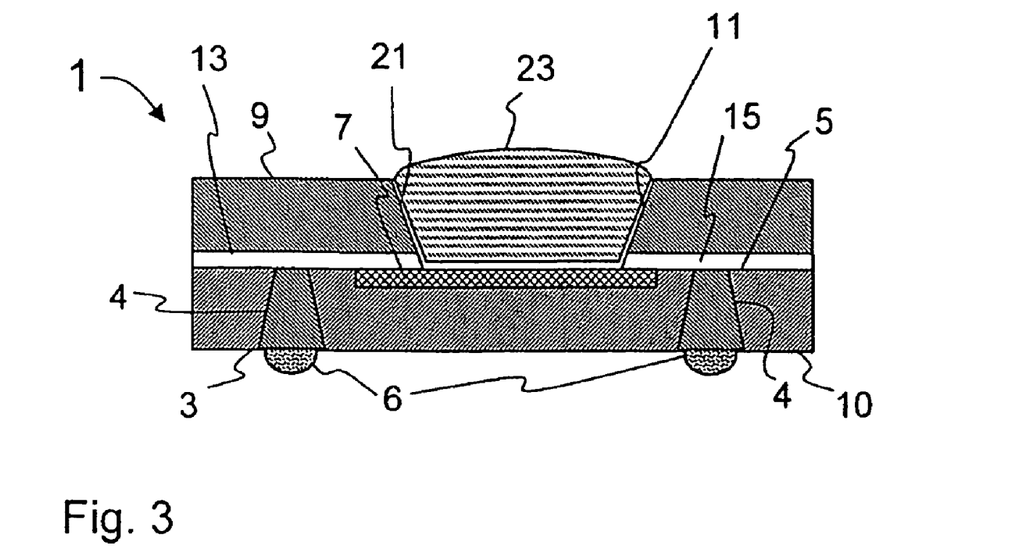
FIG. 3 shows a cross section through an embodiment of the invention with a support patterned as a mechanical fit for optical lenses.

FIG. 3 shows a further embodiment of the component 1 according to the invention, in which the patterned support 9 has a functional structure 11 in the form of a mechanical fit 21. The form of the fit 21 is matched in accurately fitting fashion to the form of an optical lens 23. The lens may be inserted into the fit 21 after the production of the component with the support. In this case, the exact seating of the lens is ensured by the accurate orientation of the patterned support 9 which has already been joined together with the semiconductor element 3 in the wafer composite.

Figure 4:
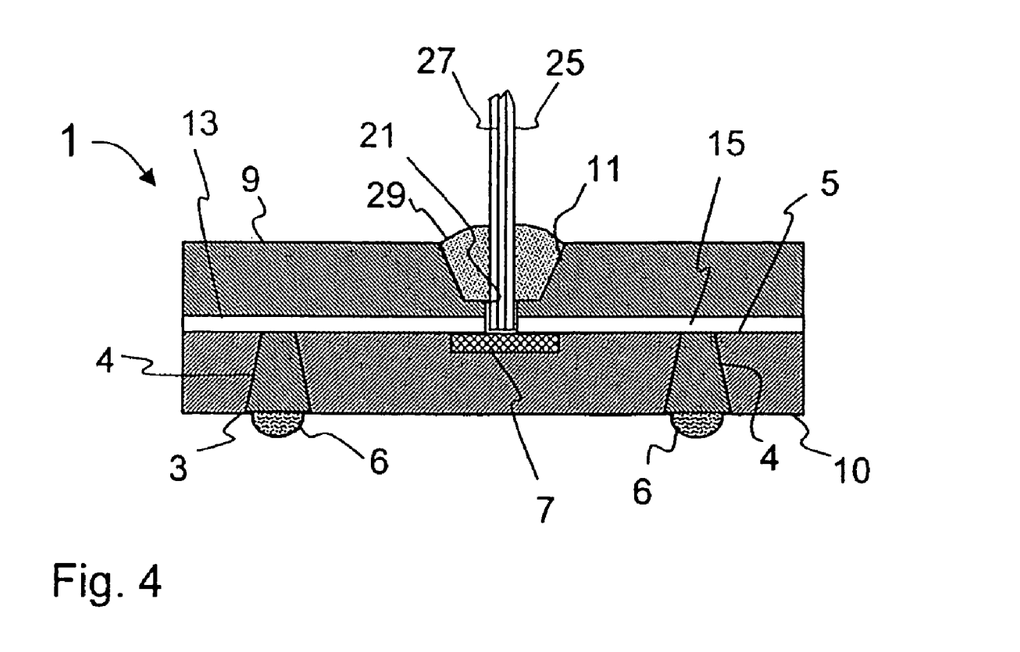
FIG. 4 shows a cross section through an embodiment of the invention with a support patterned as a mechanical fit for a waveguide.

FIG. 4 shows an embodiment in which the support 9 has a fit 21 serving for receiving and positioning a waveguide 25. After the waveguide 25 has been introduced into the fit 21, it can be fixed to the component 1 by means of an adhesive bond 29.

By means of the production according to the invention, the support 9 and, connected therewith, the fit 21 can be positioned above the semiconductor element 3 so accurately that the sensor or photo emitter layer 7 can be kept correspondingly small, since the light-guiding waveguide core 27 is oriented correspondingly accurately with respect to the sensor or photo emitter layer 7 by means of the fit 21. In this way, it is also possible, accordingly, to reduce the dimensions of the component or else to couple a plurality of waveguides to an optoelectronic component with a small space requirement.

In all the preceding examples, a transparency of the patterned support was not absolutely necessary. The latter may therefore be produced from semiconductor material, for example. By way of example, the support may also have the same material as the semiconductor element, as a result of which the component becomes less temperature-sensitive overall on account of the same thermal expansion coefficients.

However, the patterned support 7 may also itself have functional structures in the form of optical elements which are transparent to the respective type of radiation.

Figure 5:
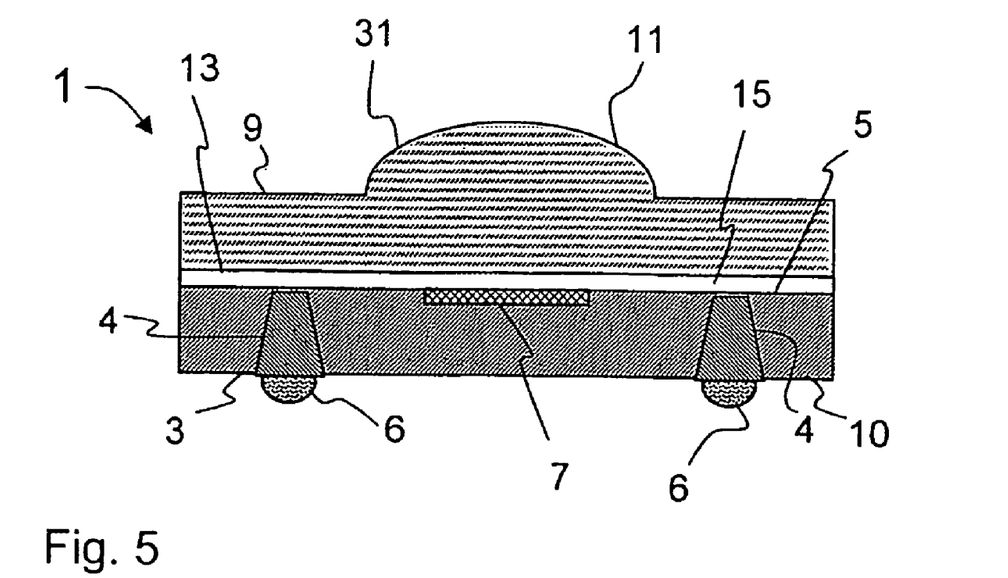
FIG. 5 shows a cross section through an embodiment of the invention with a transparent patterned support with a lens.

Such an embodiment is illustrated in FIG. 5. In this case, the support 9 comprises a transparent material, such as glass, for example. In this embodiment, the functional structure 11 comprises a lens 31, which is assigned to the sensor-technologically active and/or emitting device 7 and can concentrate light emitted by the device 7 or focus light impinging on the component 1 on the device 7.

Besides materials transparent to visible light, such as glass, the material of the support may also comprise semiconducting materials, such as GaAlAs, which are transmissive to infrared light.

Figure 6:
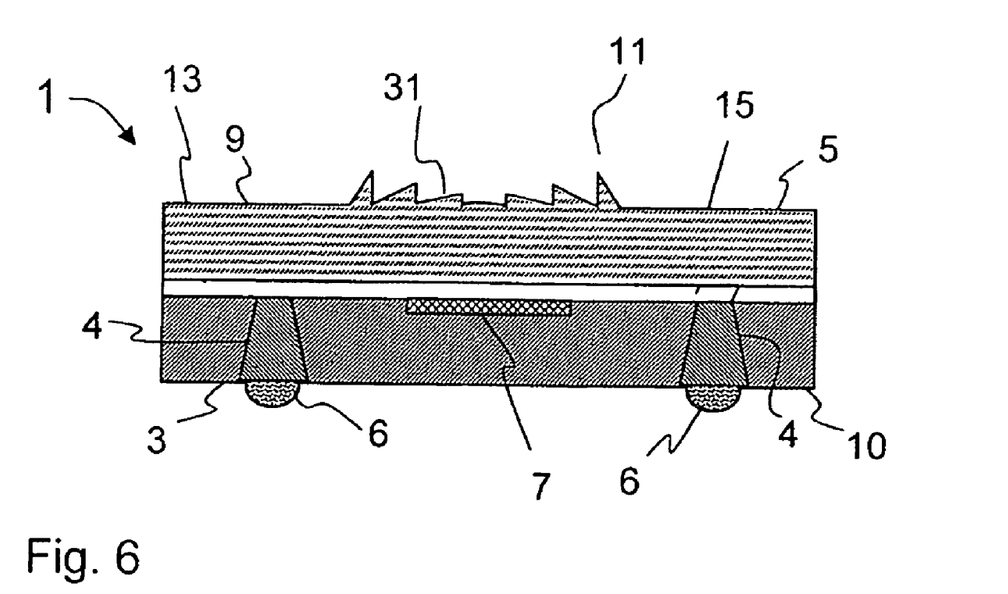
FIG. 6 shows a cross section through a modification of the embodiment of the invention illustrated in FIG. 5 with a prism lens.

FIG. 6 illustrates a variant with respect to the embodiment shown in FIG. 5. The functional structure 11 of the patterned support comprises a prism lens 31 in the variant shown in FIG. 6.

As in the preceding exemplary embodiments, the patterned support 9 may have not only a single layer. Rather, multilayer patterned supports are also possible, the joining together of the support with the wafer on which the die for the semiconductor element is situated being effected in the wafer composite. The multilayer support 9 may thus have, in each of its layers, a structure which is functional for the sensor-technologically active and/or emitting device 7.

Figure 7:
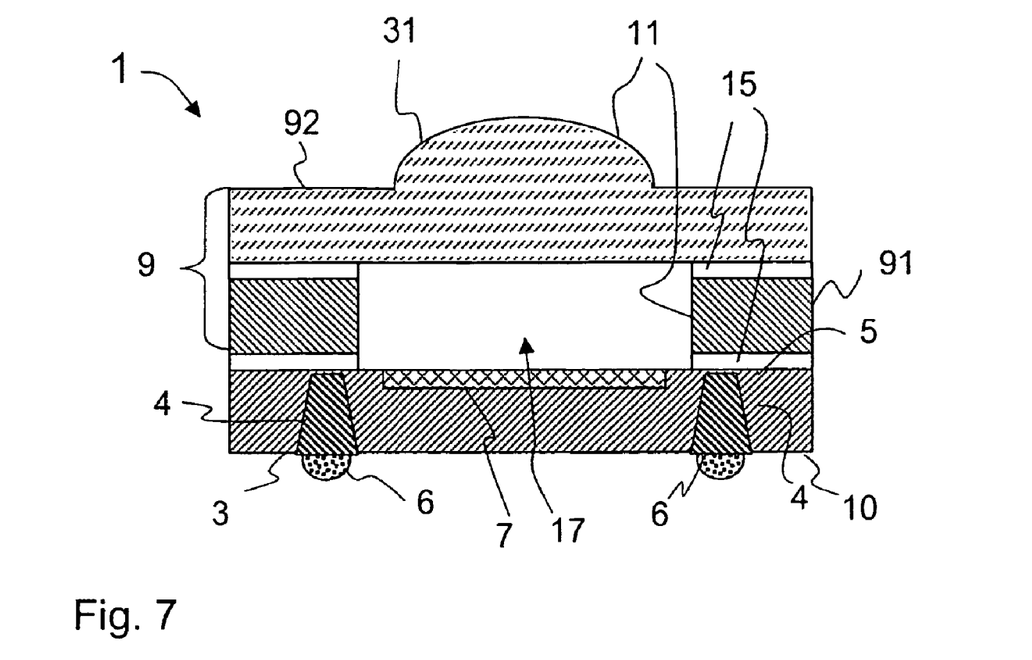
FIG. 7 shows a cross section through an embodiment of the invention with a multi-layered patterned support with a lens.
Figure 8:
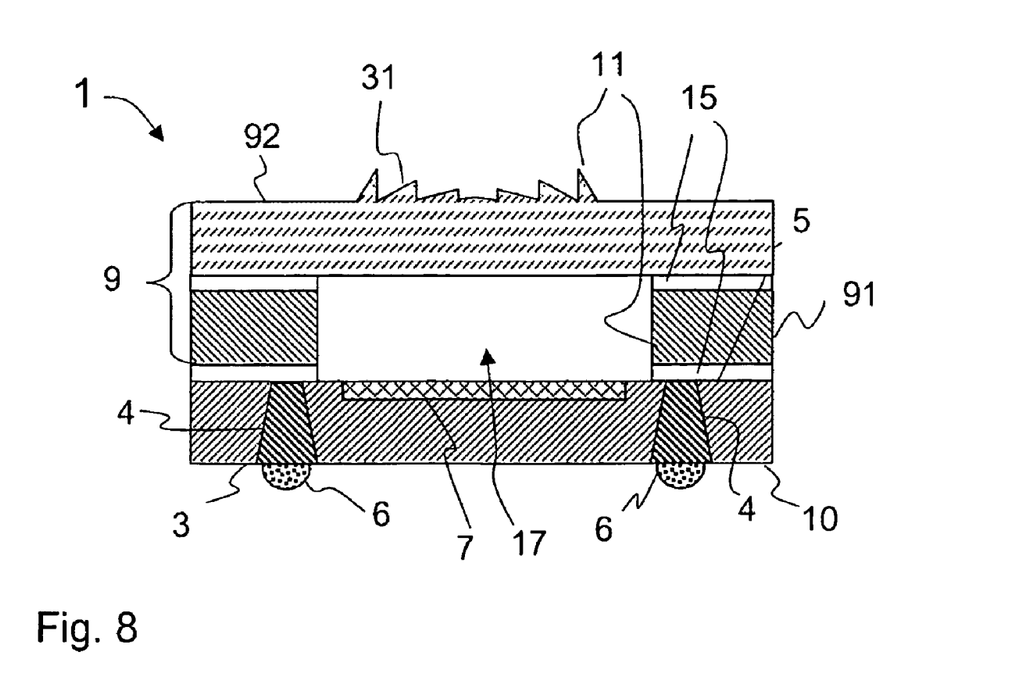
FIG. 8 shows a cross section through a modification of the embodiment of the invention illustrated in FIG. 7 with a prism lens.

Examples of such embodiments are shown in FIGS. 7 and 8. Here, the patterned support 9 comprises two layers 91 and 92 connected to one another via a further connecting layer 15. In both variants, the layer 92 comprises a transparent material, such as, for instance, glass or plastic or infrared-transmissive GaAlAs, and has functional structures 11 in the form of at least one lens 11.

The layer 92 serves as a spacer of the lens with respect to the sensor-technologically active and/or emitting device 7. As a functional structure, a passage 17 is inserted into the layer 91 and enables the light concentrated by the lens 31 to pass from and to the sensor-technologically active and/or emitting device 7.

The variant shown in FIG. 8 differs from the variant shown in FIG. 7 in that a prism lens is used instead of a convex lens structure as in FIG. 7.

The spacer of the embodiments shown with reference to FIGS. 7 and 8 permits a lower focal length for focusing and thereby reduces for example the image errors in the plane of the sensor-technologically active and/or emitting device 7.

Figure 9:
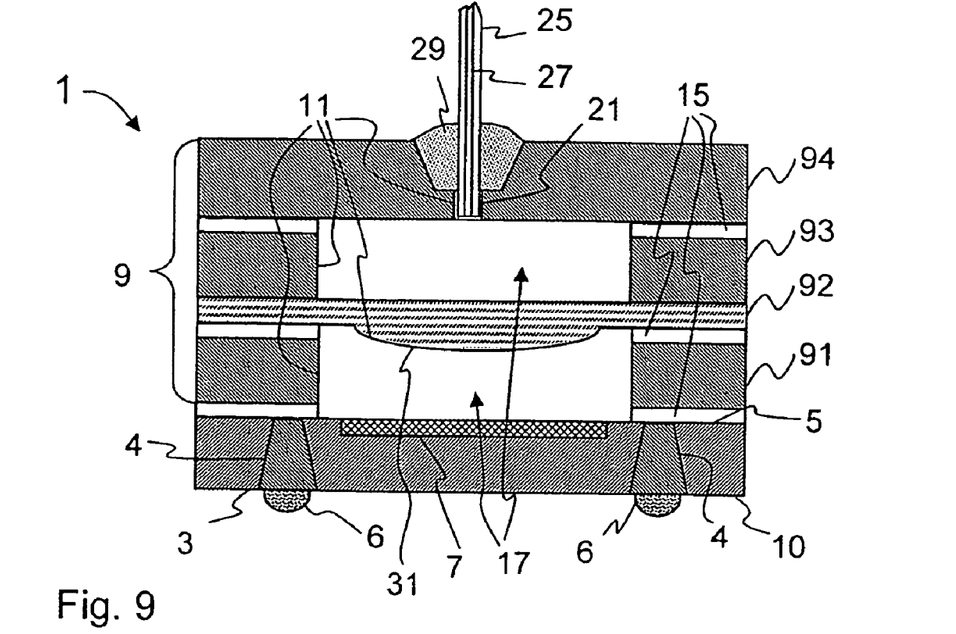
FIG. 9 shows a further embodiment with a multilayer patterned support.

FIG. 9 shows yet another embodiment with a multilayer patterned support. The support 9 of this exemplary embodiment comprises four layers 91, 92, 93 and 94. In this case, the layers 91 and 93 are formed as a spacer in a manner similar to layer 91 of the embodiments described with reference to FIGS. 7 and 8. Situated between these two layers is a layer having a lens 31 as functional structure 11. Layer 94 has a fit 21 for a waveguide 25. With a construction of this type, it is thus possible either for light signals which emerge from the waveguide core 27 to be focused onto the sensor-technologically active and/or emitting device 7 or for light emitted by the device 7 to be concentrated precisely on the waveguide core 27.

The layer sequence or the functional structures of the individual layers are not, of course, restricted to the exemplary embodiments shown. Rather, these may be combined with one another as desired depending on the intended application. In particular through the use of materials which are adapted to one another in terms of the thermal expansion coefficient, it is thus also possible to produce complex and precise optical arrangements for optoelectronic components.

Figure 10:
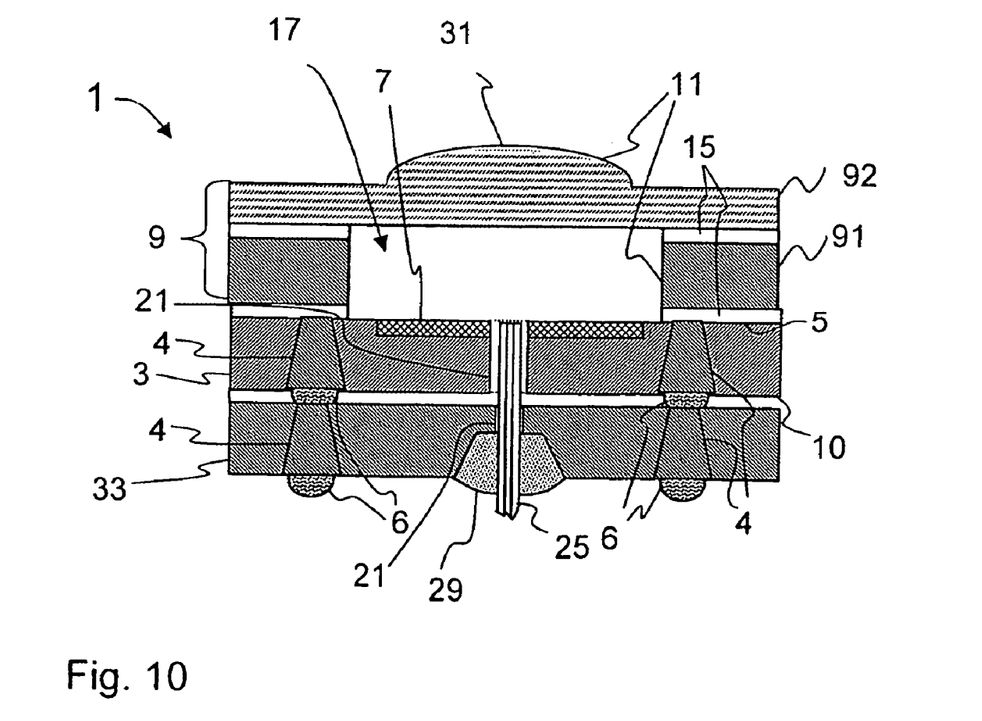
FIG. 10 shows an embodiment with functional structures on opposite sides of the electronic component.

FIG. 10 illustrates an embodiment in which, in addition, the semiconductor element itself has structures which are functional for the sensor-technologically active and/or emitting device. Accordingly, the side opposite to that side of the semiconductor element which has the sensor-technologically active and/or emitting device 7 likewise has functional structures.

In this exemplary embodiment, the multilayer patterned support 9 is similar to the embodiment shown with reference to FIG. 7. In addition, the semiconductor element 3 has, as a functional structure, a fit for a waveguide which is fed to the component 1 from the underside 10. In addition, the electronic component comprises a chip stack comprising the semiconductor element 3 with the sensor-technologically active and/or emitting device 7 and a further chip 33, onto which the chip, or the semiconductor element 3, is placed. In the same way as the joining together with the support, the placement may likewise be effected in the wafer composite. The further component 33 likewise has a fit 21 which guides the waveguide 25 and to which the latter may be connected by means of an adhesive joint 29, for example.

Figure 11:
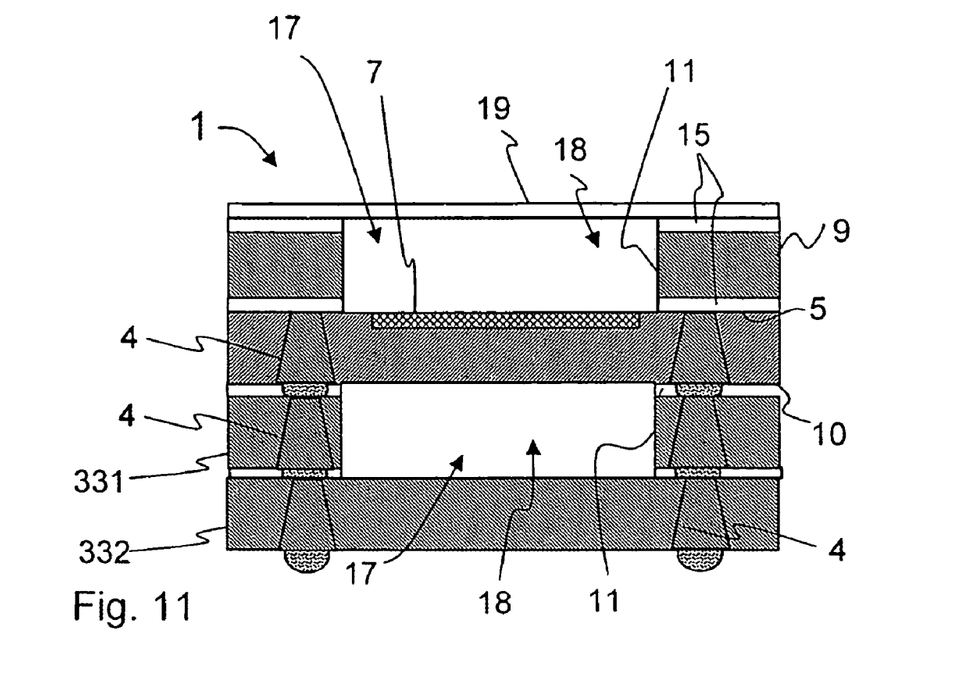
FIG. 11 shows an embodiment with cavities on opposite sides of the semiconductor element.

FIG. 11 shows a further embodiment of the electronic component, which has cavities 18 on opposite sides of the semiconductor element 3. The cavities may be used for example as cavities for applications in radio frequency technology. The cavities are formed by the walls of the passage openings 17 of the patterned support 9, or respectively of the patterned base 331, and the respective coverings. The covering of the patterned base 331 is produced with a further base 332, while the patterned support 9 in this embodiment is provided with a covering 19 in a manner similar to the components shown with reference to FIGS. 1A and 1B.

Figure 12:
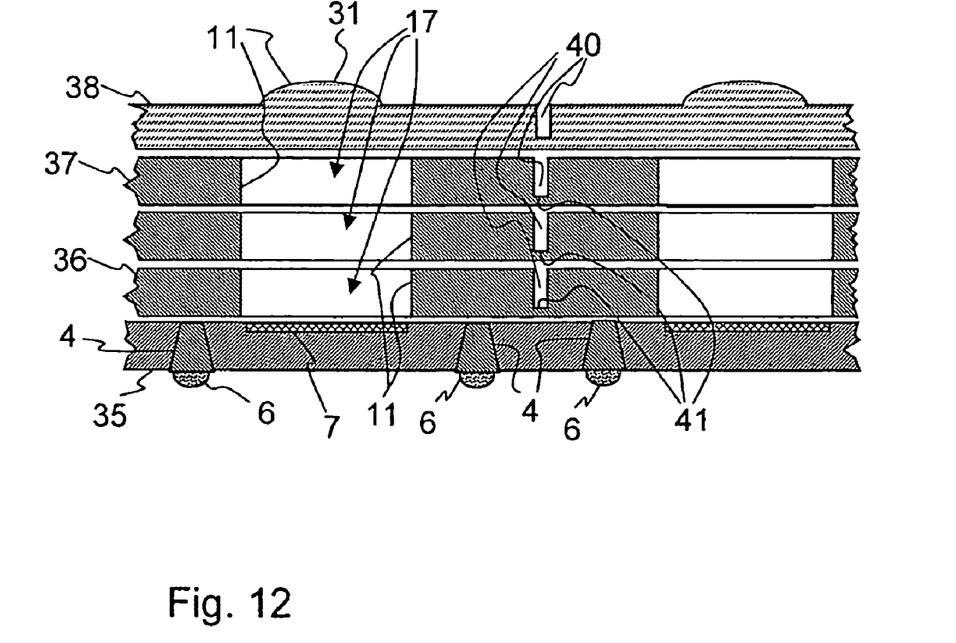
FIG. 12 shows a cross section through a stack comprising wafer and patterned support which is assembled in the wafer composite.

In particular when multilayer supports are used, the overall construction of the parts joined together in the wafer composite may reach a thickness which no longer readily permits conventional dicing. FIG. 12 shows a cross section through a detail from such a construction in the wafer composite prior to dicing. The wafer 35, which has the dies for the semiconductor elements 3 with the sensor-technologically active and/or emitting device 7, has further wafers 36, 37, 38, 39 joined together with it, which form the patterned support 9. Said support comprises spacers with passage openings 17 and a wafer having a refractive structure 11 in the form of integrated lenses 31. This construction affords the advantage over a solid transparent support having integrated lenses that a relatively thin transparent wafer 38 can be used for the same refractive power.

In order to be able to separate this relatively thick structure comprising the wafers 35 to 38, it is advantageous if the wafers have, at least in part, separating points 40. The separating points are connected to one another via individual webs 41 in order to enable the wafers to have the necessary stability for packaging or joining together of the wafers 35 to 38 in the wafer composite. Said webs can then be separated in a simple manner by wet-chemical or dry-chemical etching or by sawing.

As an alternative to the patterning of separating points in the wafers before the joining-together process, the latter may also first be joined together with their base and then be patterned. Moreover, the order of joining together and patterning may also alternate for the individual layers of the support, which may be expedient for example if the individual layers have different materials and/or thicknesses. Thus, by way of example, the first layer of the support may be joined together with the semiconductor wafer, having the dies, and the patterning may then be performed, whereupon afterward, as further layer of the support, for instance, a prepatterned layer is joined together with the first layer. The sequence may, of course, be modified in any desired manner and be applied to as many layers as desired.

After the singulation or the separation from the wafer, the side walls may then subsequently be passivated, if appropriate. This may be done for example by means of suitable deposition methods, such as wet-chemical deposition, vapor deposition, sputtering, CVD or PVD coating.

Finally, the wafer stack may be subjected to surface treatment in the wafer composite. By way of example, the optical properties of the lenses 31 may be improved by means of an antireflection coating or an IR coating. Moreover, antiscratch or anticorrosion layers may be applied in order to increase the durability. These coatings can be produced, inter alia, in a known manner by means of CVD or PVD methods.

The functional structure 11 of the wafer as shown in FIG. 12, said structure comprising an array of lenses 31, may also be applied to the wafer stack after the latter has been produced. In this case, either individual lenses, as are shown for instance in FIG. 3, may be applied instead of the wafer 38, or said lenses may be produced on the stack, for example as polymer reflow lenses.

LIST OF REFERENCE SYMBOLS

1 Electronic component
3 Semiconductor element, die
4 Plated-through hole
5 Top side of the semiconductor element
6 Soldering bead
7 Sensor-technologically active and/or emitting device
9 Patterned support
91,92,93,94 Layers of the patterned support
10 Underside of the semiconductor element
11 Functional structure
13 Underside of the patterned support
14 Optical element
15 Connecting layer
17 Passage opening
18 Cavity
19 Covering
21 Mechanical fit
23,31 Lenses
25 Waveguide
27 Waveguide core
29 Adhesive
33,331,7332 Semiconductor base
35,36,37,38 Wafer
40 Separating point

What is claimed is:

1. A multilayer patterned wafer composite, comprising:
 a first non transparent semiconductor wafer having a top and a bottom surface;
 a sensor-technologically active device and/or an emitting device located on the top surface of the first wafer;
 a layer having at least one optical element; and
 a second non transparent semiconductor wafer having a cavity extending between a second wafer top surface and a second wafer bottom surface, the second semiconductor wafer acting as a spacer between said at least one optical element and said first semiconductor wafer;
 wherein said cavity is filed with a material selected from a group consisting of a gas, a fluid, and a low-k material.

2. A multilayer patterned wafer composite, comprising:
 a first non transparent semiconductor wafer having a top and a bottom surface;
 a sensor-technologically active device and/or an emitting device located on the top surface of the first wafer;
 a layer having at least one optical element; and
 a second non transparent semiconductor wafer having a cavity extending between a second wafer top surface and a second wafer bottom surface, the second semiconductor wafer acting as a spacer between said at least one optical element and said first semiconductor wafer;
 wherein said cavity is a resonator.

3. The multilayer patterned wafer composite of claim 2, wherein said cavity is adapted to generate or detect RF waves, microwaves or ultrasound.

* * * * *